United States Patent [19]
Ozturk et al.

[11] Patent Number: 5,162,246
[45] Date of Patent: Nov. 10, 1992

[54] SELECTIVE GERMANIUM DEPOSITION ON SILICON AND RESULTING STRUCTURES

[75] Inventors: Mehmet Ozturk, Cary; Jimmie Wortman, Chapel Hill; Douglas Grider, Raleigh, all of N.C.

[73] Assignee: North Carolina State University, Raleigh, N.C.

[21] Appl. No.: 790,230

[22] Filed: Nov. 8, 1991

Related U.S. Application Data

[62] Division of Ser. No. 515,589, Apr. 27, 1990, Pat. No. 5,089,872.

[51] Int. Cl.⁵ .......................................... H01L 21/265
[52] U.S. Cl. ...................................... 437/41; 437/192; 437/203; 437/984
[58] Field of Search ................. 437/41, 192, 203, 984; 148/DIG. 58, DIG. 59; 357/23.9

[56] References Cited

U.S. PATENT DOCUMENTS

| | | | |
|---|---|---|---|
| 4,593,307 | 6/1986 | Rupprecht et al. | 357/67 |
| 4,824,798 | 4/1989 | Burnham et al. | 148/DIG. 59 |
| 4,945,393 | 7/1990 | Beltram et al. | 357/23.5 |
| 5,037,775 | 8/1991 | Reisman | 148/DIG. 58 |
| 5,089,428 | 2/1992 | Verret et al. | 148/DIG. 59 |

FOREIGN PATENT DOCUMENTS

| | | | |
|---|---|---|---|
| 112772 | 5/1989 | Japan | 357/23.11 |
| 29119 | 1/1990 | Japan | 148/DIG. 59 |

Primary Examiner—Brian E. Hearn
Assistant Examiner—Kevin M. Picardat
Attorney, Agent, or Firm—Bell, Seltzer, Park & Gibson

[57] ABSTRACT

The invention is a method of selectively forming contacts on ultra shallow source and drain junctions. The method comprises forming a gate structure that defines a gate on a silicon substrate, portions of which are covered with a layer of silicon dioxide while the portions adjacent the gate form a silicon surface. The gate structure includes a surface material upon which germanium will not deposit at a temperature that is otherwise high enough to cause germanium to deposit from a germanium containing gas onto a silicon surface, but that is lower than the temperature at which germanium will deposit on the gate surface material. A source and drain are formed in the silicon substrate in the portions adjacent the gate by adding dopant atoms and in which the source and drain are separated by an active region of the silicon substrate defined by the gate structure. The substrate is then exposed to a germanium containing gas at a temperature high enough to cause the germanium to deposit from the germanium containing gas onto the silicon surface but lower than the temperature at which the germanium will deposit on the gate structure surface material. The result is self-aligned germanium contacts to the source and the drain. The method can further comprise selectively depositing a metal on the germanium and annealing the deposit to form a germanide compound from the reaction between the deposited germanium and the deposited metal.

26 Claims, 2 Drawing Sheets

SELECTIVE GERMANIUM DEPOSITION ON SILICON AND RESULTING STRUCTURES

This application is a divisional of application Ser. No. 07/515,589, filed Apr. 27, 1990 now U.S. Pat. No. 5,089,872.

FIELD OF THE INVENTION

The present invention relates to the manufacture of semiconductor devices using self-aligning techniques and in particular relates to a method of using low pressure chemical vapor deposition of germanium thin films to produce self-aligned semiconductor structures and devices. This application is related to Ozturk, et al, Ser. No. 07/515,595 now U.S. Pat. No. 5,101,247 filed concurrently herewith for "Low Temperature Deposition of Germanium on Silicon Dioxide and Resulting Products."

BACKGROUND OF THE INVENTION one of the continuing goals for the semiconductor industry is the production of ever smaller individual devices and resulting denser integrated circuits. In order to produce devices having dimensions which are small enough to meet the requirements of ultra large scale integration (ULSI) both the lateral and vertical dimensions of such devices must be correspondingly reduced. In particular, there is a need for reliable technologies that can be used to both form and contact ultra shallow p-n junctions such as source and drain junctions in MOSFETs, particularly those designed for complimentary metal-oxide-silicon (CMOS) integrated circuits. More specifically, the formation of reliable, high quality, low resistance contacts with p-n junctions shallower than 100 nanometers (nm) is a particular goal.

Presently, such p-n junctions are typically formed by ion implantation followed by silicidation. As is known to those familiar with the manufacture of such devices, ion implantation refers to the process in which appropriate dopant atoms are ionized, accelerated, and directed at a semiconductor material so that the accelerated ions bombard and become implanted in the semiconductor material. Following an annealing step which helps restore the bombarded crystal and activates the implanted dopant atoms, a portion of the semiconductor material results that has a desired conductivity (p or n) that results from the presence of the implanted ions and that is often opposite that of the adjacent non-implanted portions of the semiconductor material. These adjacent p-type and n-type regions define p-n junctions therebetween.

As further known to those familiar with such processes, silicidation is the process of forming a metal-silicon compound for use as a contact with a portion of a device such as a junction. The process is desireable because the resulting silicide composition typically has a lower resistivity than does silicon alone. Silicidation is often carried out by depositing a metal such as titanium, cobalt, or tungsten onto silicon followed by either conventional furnace annealing or rapid thermal annealing to form the metal silicide.

Another goal in the manufacture of such devices and their integrated circuits is to be able to use self-alignment (or "selective") techniques in the manufacturing process. As is known to those familiar with such processes, semiconductor devices, particularly those formed into integrated circuits, are often formed using photolithography techniques and a series of masks to selectively define, deposit, or remove materials such as metals, semiconductors and insulators until a desired device has been produced. When several adjacent layers of materials are processed in this manner, the accuracy and precision required makes the processes expensive and time consuming. Furthermore in some cases even the best available accuracy falls short of physical and electronic requirements.

In self-alignment techniques, portions of an existing structure themselves are used to define the areas where other materials will be deposited or other processes will take place. This helps eliminate the use of a separate mask and lithography step for one or more of the manufacturing steps. For example, a MOSFET (metal-oxide-semiconductor field effect transistor) can be produced using self-alignment techniques once an appropriate gate structure is in place. Such a gate structure on a silicon substrate will mask the underlying silicon substrate from the effects of ion implantation. Thus, in producing a self-aligned MOSFET, the portions of the silicon substrate adjacent the gate structure are doped by ion implantation while the substrate below the gate structure is not. The result is a "self-aligned" source and drain produced without an additional masking step.

In a typical MOSFET process, polysilicon is deposited over the gate oxide, and then the polysilicon and the oxide are patterned together to form the aligned gate structure. The self-aligned source and drain are then formed by ion implantation and anneal. Polysilicon can, of course, withstand the annealing temperatures.

Thus, a typical MOS manufacturing process will use polysilicon for the gate electrode to take advantage of self-alignment techniques, followed by an ion implant and anneal cycle and a silicidation step to form appropriate metallized contacts to the source and drain.

Silicidation of silicon, however, raises associated disadvantages and difficulties in the production of ever smaller devices. In particular, the nature of the silicidation process causes a significant amount of silicon to be consumed below the gate oxide-silicon interface level. During the process silicide is formed from the chemical reaction between the deposited metal and the underlying silicon. This typically unavoidably results in the consumption of the silicon below the gate oxide level of a structure such as a MOS transistor. This silicon consumption during the silicidation process can lead to large leakage currents and even device failure. As an illustrative example, when a 10 nm layer of titanium is deposited and then annealed to form titanium silicide, approximately 25 nm of silicon will be consumed. This means that an ultra shallow 75 nm junction will be totally consumed by a titanium layer 30 nm thick used to produce titanium silicide.

A potential solution to this problem has been to selectively deposit additional silicon (either crystalline or polycrystalline) on the substrate over the source and drain portions to form an additional buffer or sacrificial layer between the substrate and the refractory metal that is eventually deposited to form the silicide. This process raises the source and drain junctions and results in what is sometimes referred to as an "UPMOS" structure. This process, however, raises yet other disadvantages. Selective deposition of silicon requires higher temperatures and may employ or produce hydrochloric acid (HCl) in the process, which in turn may damage the structure. Also, dopant diffusion can often take place at the temperatures required to deposit the silicon layer, thus compromising or destroying device performance. Finally, selective deposition of silicon for this application is generally difficult to achieve from a technical standpoint and is thus desirably avoided.

There thus exists the need for techniques for producing ultra shallow devices which incorporate the advantages of low resistance offered by silicides, but which avoid the consumption of silicon during silicide formation that otherwise makes the process destructive of the device being manufactured.

There thus exists the need for a method of producing devices in a self-aligned fashion at moderate temperatures which do not affect the other characteristics of the device and at overall lower or more efficient thermal budgets and that support the ability to produce lower resistivity contacts with the appropriate portions and junctions using compounds of refractory metals.

OBJECT AND SUMMARY OF THE PRESENT INVENTION

It is therefore an object of the present invention to provide a method and resulting devices for producing ultra shallow, self-aligned metal-oxide-semiconductor structures that exhibit high quality junction properties and low resistivity.

The invention accomplishes this object with a method of selectively forming high quality, low resistance self-aligned contacts on ultra shallow junctions such as source and drain junctions. The method of the invention comprises, for example, the forming of a MOSFET on a silicon substrate having a first conductivity type and in which portions of the silicon substrate are covered with a dielectric layer such as silicon dioxide to form the gate structure, while the portions adjacent the gate leave exposed silicon surfaces which will become the source and drain areas. A source and drain are formed in the silicon substrate in the portions adjacent the gate by adding dopant atoms that define the source and drain and in which the source and drain have the opposite conductivity type from that of the silicon substrate and in which the source and drain are separated by an active region of the silicon substrate defined by the gate structure. The substrate is then exposed to a germanium containing gas at a temperature high enough to cause the germanium to deposit from the germanium containing gas onto the silicon surface of the substrate but lower than the temperature at which the germanium will deposit on the surface layer of the gate structure. In order for this to work, the surface of the gate structure includes a material (such as silicon dioxide) upon which germanium will not deposit at a temperature that is otherwise high enough to cause germanium to deposit from a germanium containing gas onto a silicon surface, but that is lower than the temperature at which germanium will deposit on the gate structure surface material. The result is self-aligned germanium contacts to the source and the drain. The method can further comprise selectively depositing a metal upon the germanium layer and annealing the structure to form a germanide compound from the reaction between the deposited germanium and the deposited metal.

The foregoing and other objects, advantages and features of the invention, and the manner in which the same are accomplished, will become more readily apparent consideration of the following detailed description of the invention taken in conjunction with the accompanying drawings, which illustrate preferred and exemplary embodiments; and wherein:

DETAILED DESCRIPTION OF THE PREFERRED EMBODIMENTS

Figure 1:
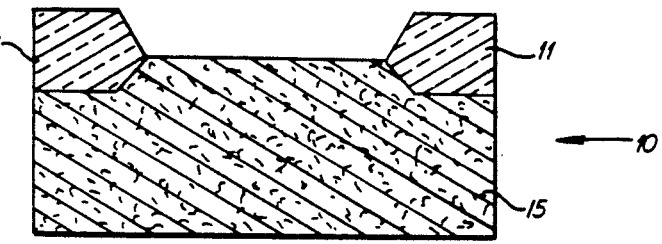
FIGS. 1-10 are respective cross-sectional views of a silicon substrate and the various materials deposited thereon and removed therefrom in a series of process steps illustrating the present invention and producing a metal-oxide-semiconductor field effect transistor according to the present invention.

The method of the invention and the resulting structures can be more clearly understood with reference to the drawings. FIG. 1 shows a portion of semiconductor material, typically silicon, such as a portion of a wafer that is broadly designated at 10. In a manner known to those familiar with such processes, the part of the semiconductor portion 10 in which the device is to be formed is physically and electronically isolated from the remainder of the wafer by oxide portions 11 which are typically silicon dioxide that have been thermally grown in a process referred to as "local oxidation of silicon" or "LOCOS." FIG. 1 thus shows an isolated portion of semiconductor material ready to be worked up into a device structure.

The method of the invention first comprises forming a gate structure that defines a gate on a silicon substrate having a first conductivity type. The gate structure of the device includes at least an oxide or dielectric adjacent to the silicon substrate while the portions adjacent the gate form a silicon surface to be used to form the source and drain areas. The surface of the gate structure comprises a material, such as silicon dioxide, upon which germanium will not deposit at a temperature that is otherwise high enough to cause germanium to deposit from a germanium-containing gas onto a silicon surface but which temperature is lower than the temperature at which germanium will deposit on the gate structure surface material.

Figure 2:
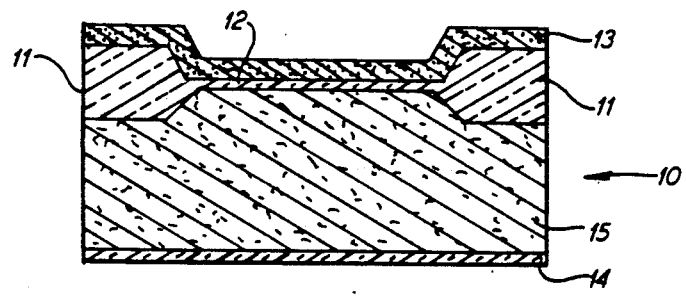

FIG. 2 shows that the preliminary steps in the formation of the gate dielectric include the formation of a layer of silicon dioxide 12 on the localized portion of silicon between the field dielectric portions 11, (for example, thermally grown localizing silicon dioxide. This layer 12 of silicon dioxide will become the gate dielectric layer when the gate is defined.

As the next step in the process, a layer of polysilicon 13 is deposited across the localized semiconductor portion 10. FIG. 2 also shows that when the silicon dioxide layer 12 that will become the gate oxide is thermally grown, an additional layer of thermally grown silicon dioxide 14 will grow on the back side of the semiconductor portion 10, and for which the remaining silicon portion is designated at 15. The desired thickness of the gate dielectric portion shown in FIG. 2 will depend on the intended gate length. For example, for a one micron ($1\mu$) gate length, the thickness of the dielectric will need to be on the order of 200 angstroms. For a gate length of $0.25\mu$, the thickness of the gate dielectric will need to be on the order of 100 angstroms. By comparison, the localizing portions of the field dielectric 11 are on the order of 3000-5000 angstroms in thickness. It will be understood therefore, that FIGS. 1-10 are somewhat schematic in nature and not drawn to scale, but rather serve to illustrate the method steps of the invention and the resulting structures.

Figure 3:
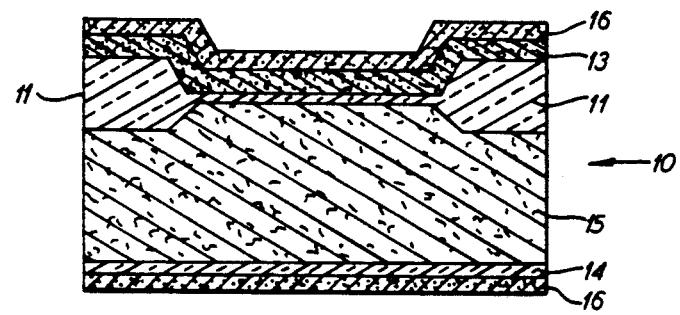

FIG. 3 shows the next step in the process, that of forming a layer of a gate structure surface material upon the polysilicon gate contact material. The surface material is one upon which germanium will not deposit at a temperature that is otherwise high enough to cause germanium to deposit from a germanium containing gas onto a silicon surface but which temperature is lower than the temperature at which germanium will deposit on the surface material. In FIG. 3, this surface material is indicated at 16 and, because of the nature of the process, is deposited on both sides of the semiconductor portion 10. In preferred embodiments, the surface material comprises silicon nitride ($Si_3N_4$) or silicon dioxide ($SiO_2$). Typically, the nitride or oxide is deposited by low pressure chemical vapor deposition.

Figure 4:
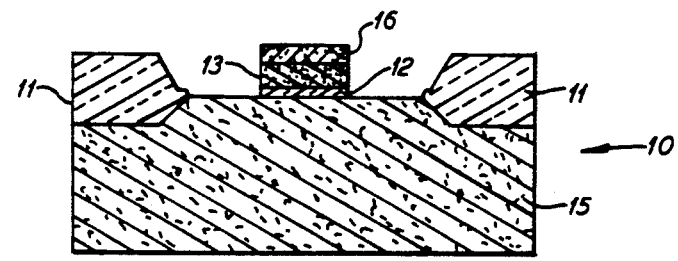

FIG. 4 illustrates the results of the next process step. These include a photolithography step for defining the gate, the nature and details of which are well known in the art and which can be determined for any particular desired pattern without undue experimentation. Following the photolithography step, the nitride (or oxide) is usually wet etched, which typically means that it is removed using a solvent, an acid, or some other liquid process. Poly-silicon is then removed with a reactive ion etch for which the silicon-nitride or silicon dioxide acts as a mask. When the remainder of the unmasked silicon dioxide is then removed in another wet etch process, the structure shown in FIG. 4 results. FIG. 4 thus shows the summary result of the steps of forming the gate oxide layer on the predetermined portion of the silicon surface of the semiconductor portion 10 for the purpose of defining a gate in the silicon substrate 15, and the following steps of forming a polysilicon gate contact on the gate oxide layer and forming a gate structure surface material upon the polysilicon gate contact. In FIG. 4, the surface material 16 is formed of silicon nitride but could similarly be formed of silicon dioxide as stated earlier. With regard to the layer of polysilicon that was illustrated as being deposited in FIG. 2 and which forms the gate contact 13, the step of forming the gate contact preferably comprises depositing a layer of polycrystalline silicon that is thick enough to prevent an ion implantation process from affecting the gate oxide portion 11 when that ion implantation process is otherwise sufficient to dope a source and a drain.

Figure 5:
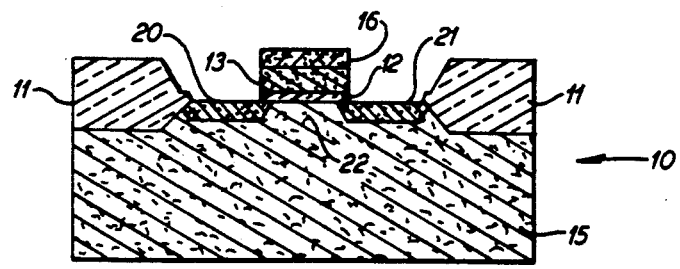

FIG. 5 shows the next step in the process, that of adding dopant atoms to certain of the silicon portions of the surface of the substrate 15 to define a source and a drain therein and corresponding p-n junctions between the source and the substrate and between the drain and the substrate. In FIG. 5, the source is designated at 20 and the drain as 21. As seen in FIG. 5, the dopant atoms that are added define the source and the drain and the source and the drain have the opposite conductivity type from that of the silicon substrate to thereby form the p-n junctions with the silicon substrate. Furthermore, the source 20 and the drain 21 are separated by an active region 22 of the silicon substrate 15 defined by the gate contact 13 and the gate dielectric 12. As stated earlier, the ion implantation technique is typically followed by an annealing step. Ion implantation generally results in dopant atoms that, because of the way they have been added, have both damaged the crystal of silicon into which they have been implanted and are somewhat randomly positioned with respect to the crystal lattice. An annealing step helps restore the silicon crystal and also causes the implanted ions to move to appropriate substitutional lattice sites where they will exhibit appropriate electronic behavior. The techniques of ion implantation and annealing in silicon are generally well known and well documented, particularly to those familiar with this art, and will not be discussed further herein other than as necessary to describe the present invention.

Figure 6:
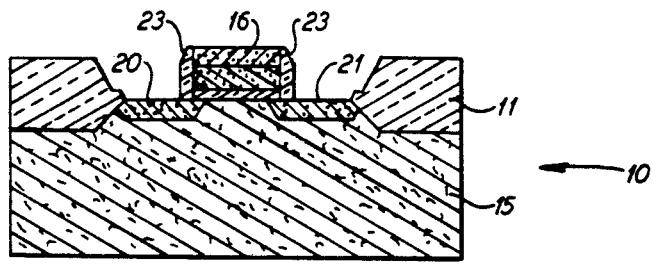

FIG. 6 shows the result of an additional step in the process. In a step which is not illustrated, the entire semiconductor portion lo is covered with a layer of silicon dioxide, for example, which is deposited by low pressure chemical vapor deposition. Most of the silicon dioxide is then removed by a directional ("anisotropic") reactive ion etching which removes most the deposited silicon dioxide but leaves behind additional sidewall portions 23 which are illustrated in FIG. 6. The purpose of these sidewalls 23 is to electronically isolate and insulate the gate contact material from the material used to contact the source 20 and drain 21 respectively, as will be further described with respect to FIG. 8.

Figure 7:
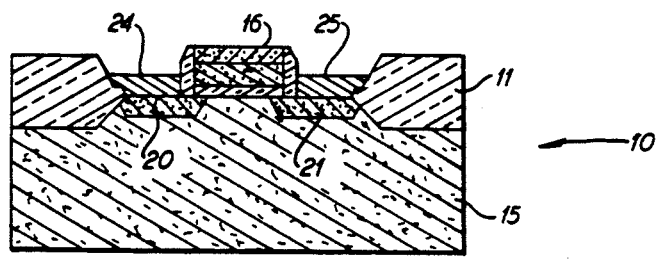

FIG. 7 shows the results of the next step in the process in which the semiconductor portion or substrate 10 is exposed to a germanium containing gas at a temperature that is high enough to cause germanium to deposit from the germanium containing gas onto the silicon surface of the substrate 15, but which temperature is lower than the temperature at which the germanium will deposit on the silicon dioxide portions 11 or the surface material 16 to thereby form self-aligned germanium contacts 24 and 25 respectively to the source and drain 20 and 21. In other words, because the germanium selectively deposits only upon intended, selected portions, no additional patterning step is required and the resulting structure is appropriately labelled as "self-aligned" As stated earlier and as familiar to those of ordinary skill in this art, each step of device manufacture that is self aligning will save a corresponding plurality of other patterning steps (masking, exposing, etching) that would otherwise be required. In the preferred embodiments the temperature at which germanium will deposit on silicon, but not on silicon dioxide under low pressure CVD conditions is no more than about 410° C.

Preferably, the step of exposing the silicon layer to a germanium containing gas comprises exposing the silicon surface to germane gas that has been pyrolyzed into a vapor that includes germanium atoms. In this regard, the chemical vapor deposition process can comprise introducing a flow of germane gas into an evacuated reaction vessel that contains the substrate 10. In preferred embodiments, the step of introducing the flow of germane gas comprises introducing a flow of a gas mixture at a pressure of no more than about 10 torr and at which the gas mixture comprises less than about 10 percent germane, with between about one and three percent germane preferred, in a carrier gas which typically comprises hydrogen or argon.

Figure 8:
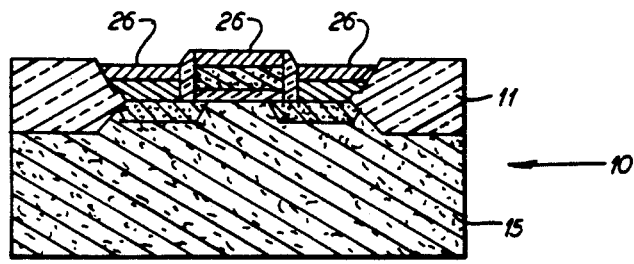

FIG. 8 illustrates the results of the next two steps in the process. The first is a wet etch that removes the nitride surface 16 (this step is not separately illustrated in the drawings), followed by the further step of selectively depositing a metal upon the layer of germanium which can later be annealed to form a germanide compound from the reaction between the deposited germanium and the deposited metal. Preferably, the step of selectively depositing a metal upon the layer of germanium comprises selectively depositing titanium, cobalt or tungsten with the deposition of tungsten presently most preferred. In this regard, the step of exposing the substrate to a germanium containing gas comprises exposing the substrate until a sufficient layer of germanium has formed that will prevent the metal selectively deposited from consuming the silicon in the source and drain regions during the annealing reaction of the metal with the germanium.

FIG. 8 also shows the semiconductor portion 10 after the deposition of the metal 26 but before the annealing step takes place. Because the nitride surface 16 on the gate contact 13 has been etched away, the tungsten metal can be deposited on the gate contact 13 as well as on the germanium portions 24 and 25. It will thus be seen that the sidewalls 23 which were previously formed provide a barrier between the tungsten on the gate contact and the tungsten on the source and drain 20 and 21 respectively. This prevents short circuits and the like in the resulting device.

In a preferred embodiment, the metal is added by the additional step of replacing the germane gas in the reaction vessel with a gas that will deposit the metal, preferably tungsten, upon the deposited germanium portions 24 and 25 and under conditions and for a time sufficient for the desired amount of the metal to deposit upon the germanium. It will be understood that the desired amount of metal is a design factor and in particular is selected to form a sufficient amount of germanide from the germanium to produce a desired level of resistivity in the resulting annealed contact. Generally speaking, the goal is to lower the resistivity of the contact to the junction. Where tungsten is to be used as the refractory metal being deposited, the step of introducing a gas that will deposit a metal comprises introducing tungsten hexafluoride ($WF_6$) and then exposing it to a temperature that is high enough to deposit tungsten on the germanium while low enough to substantially prevent diffusion of any dopants among the source 20, drain 21, and substrate 15. Tungsten deposition is usually carried out at temperatures less than 400° C. so that dopant diffusion is generally not a problem.

In all of the gas deposition steps, the heating is preferably carried out in a rapid thermal furnace, although conventional furnaces can also be used with the invention. As is known to those familiar with semiconductor manufacturing techniques, a rapid thermal furnace generally comprises a reaction vessel which includes one or more windows which are optically transparent to electromagnetic radiation of a certain frequency. In particular, the windows are often made of quartz and are transparent to infrared frequencies. The furnace produces infrared radiation that a silicon wafer absorbs very efficiently as the emission spectrum of the lamp closely matches the absorption spectrum of silicon. Thus, rapid thermal furnaces are essentially "cold wall" machines that minimize contamination that a conventional furnace would encourage. As a result, the gases react with the hot wafer and undergo the desired deposition reactions. Using such an oven, the deposition techniques of the present invention can be controlled rather accurately simply by controlling the time during which any one of the particular precursor gases is introduced and the wafer irradiated. Thus, the step of exposing the substrate to a germanium containing gas preferably comprises introducing germane gas into the reaction vessel and rapidly heating the substrate, and the step of introducing tungsten fluoride preferably comprises rapidly heating the silicon substrate to a temperature high enough to deposit tungsten on germanium while low enough to substantially prevent diffusion of any dopants between the source, the drain, and the substrate.

In a particular preferred embodiment, a LEISK ™ rapid thermal processor manufactured by Leisk Engineering Limited, Albert Drive, Burgess Hill, West Sussex, RH159NX, England was used. The system included a low-pressure, water-cooled, stainless steel process chamber with quartz windows. A low pressure was maintained by a mechanical pump that provided the base pressure of approximately 10 mTorr. A wafer to be processed was heated by two banks of quartz halogen lamps located on each side of the reaction tube with the upper bank oriented at 90° to the lower bank, thus providing intensity contouring in the x- and y-directions to reduce temperature gradients across the wafer. The wafer itself was held on a quartz holder suspended from the chamber door by a cantilever quartz system. The temperature was monitored by an optical pyrometer (wavelength of 3.5–4.1 μm) focused at the center of the wafer.

In preferred embodiments, the Ge depositions were carried out using either 3.3% or 7.8% GeH diluted in either hydrogen ($H_2$) or argon (Ar). The pyrometer was calibrated for each deposition temperature using a test wafer with an imbedded R-type thermocouple because the emissivity of a silicon wafer is a strong function of temperature at temperatures below 600° C. In addition, to eliminate emissivity changes resulting from Ge deposition on Si, a 1000 angstrom $SiO_2$ film was left unetched on the backside of the wafers (p or n type, <100>). Ge and Si have different optical properties and the reflections from the interfaces result in constructive and destructive interference and hence change the effective emissivity of the wafer. In this way the back side emissivity remained constant because the selective nature of the deposition process prevented deposition on the back side of the wafer. The oxide layer on the wafer front side was either completely etched for blanket Ge deposition or patterned for selective Ge deposition. Patterning was achieved by photolithography and wet chemical etching in a 10:1 buffered HF solution.

Using such a procedure and with argon as the carrier gas, the deposition of Ge was found to be selective up to 425° C. With H, as the carrier gas, the deposition was selective up to 600° C.

Figure 9:
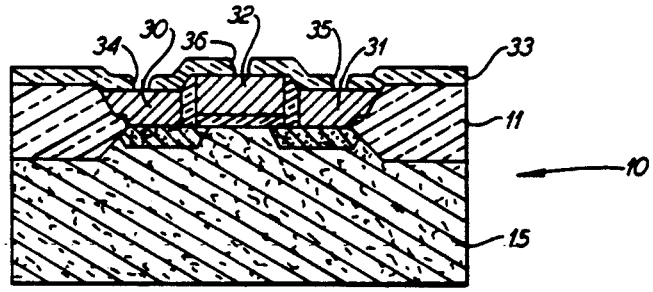

FIG. 9 shows the semiconductor portion 10 after several more steps have been carried out. As illustrated therein, the metal and germanium portions have been annealed as have been the metal and poly-silicon on the gate contact. The annealed source and drain contacts are illustrated at 30 and 31 respectively, and the annealed gate contact is illustrated at 32. A passivation layer 33 formed of a appropriate substance is deposited over the entire device, and in a preferred embodiment is formed of silicon dioxide. FIG. 9 also shows that where metal contacts such as those made of aluminum are desired, respective contact holes 34, 35 and 36 can be opened in the passivation layer 33 to respectively contact the source, the drain, and the gate.

Figure 10:
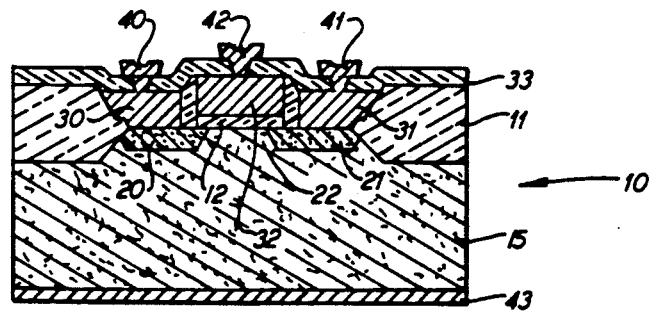

FIG. 10 shows the resulting MOSFET transistor with aluminum contacts 40, 41 and 42 in physical and electrical contact with the annealed portions 30, 31 and 32 respectively. It will be understood by those familiar with such devices that for some applications such as bonding or testing the aluminum may be included, but in portions of some integrated circuits, the contacts formed of the respective silicide or germanide compounds may be sufficient to complete the device. FIG.

10 also shows a back contact 43 also formed of aluminum. If aluminum is deposited by an evaporation process, however, a layer such as 43 will not be present.

In an alternative embodiment, the method of the invention includes a rearrangement of some of the steps in the process. In particular, following the selective oxidation of the substrate to produce the predetermined pattern of silicon and silicon dioxide on the surface, germane gas is introduced into the evacuated reaction vessel containing the substrate. The wafer is next rapidly heated to the temperature at which the germane gas pyrolyzes into germanium atoms that will deposit on the silicon surface, but which temperature is lower than the temperature at which germanium atoms will deposit on a silicon dioxide surface so that the germanium selectively deposits on the silicon surface and not upon the silicon dioxide. As stated earlier, the use of a rapid thermal furnace permits the pyrolysis of the germane gas and the resulting deposition of a layer of germanium to be quickly and accurately controlled by rapidly starting and stopping the radiant heating process.

At this point, in a manner somewhat different from the first embodiment, the dopant atoms desired for the respective source and drain are added to the deposited germanium. The deposited germanium is then annealed to diffuse the dopant atoms into the silicon surface adjacent the deposited germanium to thereby form doped silicon portions that define corresponding p-n junctions with other portions of the silicon substrate and for which the deposited annealed germanium serves as the contact material.

In this second embodiment, the method can further comprise the step of replacing the germane gas in the reaction vessel with a gas that will deposit a metal upon the deposited doped germanium and under conditions and for a time sufficient for a desired amount of the metal to deposit upon the germanium. The method can then further comprise the annealing the deposited metal and germanium to both form the metal germanide compound upon a silicon portions while the dopants diffuse from the germanium to the silicon to form the source, the drain, and the resulting junctions.

The resulting transistor illustrated in FIG. 10 can be structurally described as a silicon substrate 15 having a first conductivity type. An oxide layer 12 is upon a defined portion of the silicon substrate 15 and forms a gate oxide bordered by a silicon surface. A gate contact 32 is positioned upon the gate oxide and together with the gate oxide 12 defines the active region 22 of the gate channel. Respective source and drain portions 20 and 21 are included which have the opposite conductivity type from the substrate 15 and form respective p-n junctions with the substrate in which the junctions are substantially defined by the borders of the gate oxide with the silicon surface so that each of the junctions is positioned beneath one of the borders of the gate oxide portion 12 with the silicon surface. Germanium containing contacts 30 and 31 are present to the source and to the drain respectively. As set forth earlier, the germanium containing contacts can comprise germanium, or a refractory metal germanide such as tungsten germanide. As additional technology becomes available, it is also expected that other germanides, such as titanium germanide, may be favorably incorporated. As further set forth earlier, where the contacts are formed of germanium, they have a thickness sufficient to prevent a reaction between the germanium and a refractory metal such as tungsten from consuming silicon in the source 20 and the drain 21 when an amount of tungsten is used that will produce an amount of tungsten germanide that will provide the desired substantially resistivity contact.

In another embodiment, the gate contact comprises a layer of polycrystalline silicon upon the gate oxide that has a thickness sufficient to support the deposition of polycrystalline germanium during the deposition process. A layer of polycrystalline germanium is present on the polysilicon and is thick enough to prevent an ion implantation process from affecting the gate oxide when that ion implantation process if otherwise sufficient to dope the source and the drain.

In the drawings and specification, there have been disclosed typical preferred embodiments of the invention and, although specific terms have been employed, they have been used in a generic and descriptive sense only and not for purposes of limitation, the scope of the invention being set forth in the following claims.

That which is claimed is:

1. A method of selectively forming high quality, low resistance, self-aligned contacts on ultra shallow source and drain junctions comprising:

forming a gate structure that defines a gate on a silicon substrate having a first conductivity type, said gate structure including at least an oxide adjacent the silicon substrate, and in which portions of the silicon substrate are covered with a layer of silicon dioxide while the portions adjacent the gate form a silicon surface, and in which the surface of the gate structure comprises a material upon which germanium will not deposit at a temperature that is otherwise high enough to cause germanium to deposit from a germanium-containing gas onto a silicon surface but which temperature is lower than the temperature at which germanium will deposit on the gate structure surface material;

forming a source and a drain in the silicon substrate in the portions adjacent the gate by adding dopant atoms that define the source and drain and in which the source and drain have the opposite conductivity type from that of the silicon substrate and thereby form p-n junctions with the silicon substrate, and in which the source and drain regions are separated by an active region of the silicon substrate defined by the gate contact; and exposing the substrate to a germanium-containing gas at a temperature high enough to cause the germanium to deposit from the germanium-containing gas onto the silicon surface of the substrate but which temperature is lower than the temperature at which the germanium will deposit on the silicon dioxide layer or on the gate structure surface material, to thereby form self-aligned germanium contacts to the source and drain.

2. A method according to claim 1 further comprising the step of selectively depositing a metal upon the layer of germanium and annealing the deposit to form a germanide compound from the reaction between the deposited germanium and the deposited metal.

3. A method according to claim 2 wherein the step of exposing the substrate to a germanium containing gas comprises exposing the substrate until a sufficient layer of germanium has formed that will prevent the metal selectively deposited from consuming the silicon in the source and drain regions during the annealing reaction of the metal with the germanium.

4. A method according to claim 2 wherein the step of selectively depositing a metal upon the layer of germanium comprises selectively depositing a metal selected from the group consisting of titanium, cobalt and tungsten.

5. A method according to claim 1 wherein the step of forming a gate structure comprises:
forming a gate oxide layer of silicon dioxide on the silicon substrate;
forming a gate contact of conductive polysilicon on the gate oxide layer; and
forming a layer of gate structure surface material on the gate contact.

6. A method according to claim 5 wherein the step of forming a layer of gate structure surface material comprises forming a layer of silicon dioxide.

7. A method according to claim 5 wherein the step of forming a layer of gate structure surface material comprises forming a layer of silicon nitride.

8. A method according to claim 1 wherein the step of exposing the polycrystalline silicon layer to a germanium-containing gas comprises exposing the polycrystalline silicon layer to germane gas that has been pyrolyzed into a vapor that includes germanium atoms.

9. A method according to claim 1 wherein the step of forming a gate structure that defines a gate on a silicon substrate comprises forming a gate structure on a portion of silicon that has been isolated by local oxidation of silicon.

10. A method according to claim 1 wherein the step of forming a source and a drain in the silicon substrate in the portions adjacent the gate by adding dopant atoms comprises ion implantation of dopant ions.

11. A method according to claim 1 wherein the step of forming a source and a drain in the silicon substrate in the portions adjacent the gate by adding dopant atoms comprises gas immersion laser doping.

12. A method of selectively depositing germanium thin films that is particularly advantageous in the fabrication of high quality, low resistance ultra-shallow p-n junction structures, the method comprising:
forming a gate structure on a silicon substrate having a first conductivity type in which the gate structure comprises a gate oxide, a layer of conductive polysilicon upon the gate oxide, and a layer of an insulating material upon the conductive polysilicon, and wherein the gate structure defines an active region in the silicon substrate with portions of the silicon surface immediately adjacent thereto;
forming a source and a drain in the silicon substrate in the portions adjacent the gate structure by adding dopant atoms that define the source and drain and in which the source and drain have the opposite conductivity type from that of the silicon substrate and thereby form p-n junctions with the silicon substrate, and in which the source and drain regions are separated by the active region of the silicon substrate defined by the gate structure;
introducing a flow of germane gas into an evacuated reaction vessel containing the substrate;
rapidly heating the substrate to a temperature at which germane gas in contact with the heated substrate pyrolyzes into germanium atoms that will deposit upon the silicon surface, but lower than the temperature at which germanium atoms will deposit upon a silicon dioxide surface so that germanium selectively deposits upon the portions of the silicon surface that define the source and drain and not upon the silicon dioxide, thereby forming germanium contacts to the source and drain; and
rapidly stopping the heating of the substrate when the desired amount of germanium has been deposited upon the silicon surface.

13. A method according to claim 12 wherein the step of forming the gate structure comprises:
selectively oxidizing a silicon substrate to produce a predetermined pattern of silicon and silicon dioxide on the surface of the substrate;
forming a layer of gate oxide silicon dioxide upon portions of the silicon surface;
forming a layer of conductive polysilicon upon the layer of gate oxide silicon dioxide;
forming a layer of insulating material upon the layer of conductive polysilicon; and
removing portions of the layers in a predetermined pattern to define a gate structure of gate oxide, polysilicon, and insulating material upon the silicon substrate.

14. A method according to claim 13 wherein the step of forming a layer of insulating material comprises forming a layer of silicon dioxide.

15. A method according to claim 13 wherein the step of forming a layer of insulating material comprises forming a layer of silicon nitride.

16. A method according to claim 12 wherein the step of introducing a flow of germane gas comprises introducing a flow of a gas mixture at a pressure of no more than about 10 torr and in which the gas mixture comprises between about 1 and 3 percent germane in a carrier gas.

17. A method according to claim 16 wherein the carrier gas comprises hydrogen or argon.

18. A method according to claim 12 further comprising the step of replacing the germane gas in the reaction vessel with a gas that will deposit a metal upon the deposited germanium and under conditions and for a time sufficient for a desired amount of the metal to deposit upon the germanium.

19. A method according to claim 18 wherein the step of introducing a gas that will deposit a metal comprises introducing tungsten fluoride at a temperature high enough to deposit tungsten on germanium while low enough to substantially prevent diffusion of any dopants between the source, the drain and the substrate.

20. A method according to claim 19 wherein the step of introducing tungsten fluoride comprises:
rapidly heating the substrate to a temperature high enough to deposit tungsten on germanium while low enough to substantially prevent diffusion of any dopants between the source, the drain and the substrate; and
annealing the tungsten and germanium to form tungsten germanide upon the source and drain.

21. A method according to claim 13 wherein the step of forming a layer of conductive polysilicon comprises depositing a layer of polycrystalline silicon that is thick enough to prevent an ion implantation process from affecting said gate oxide when that ion implantation process is otherwise sufficient to dope said source and said drain.

22. A method according to claim 13 further comprising adding a passivation layer to the source, the gate, and the drain.

23. A method according to claim 22 further comprising opening contact holes in the passivation layer adjacent the source, gate and drain respectively, and depositing a metal in the contact holes to form metallized contacts respectively therewith.

24. A method of selectively depositing germanium thin films that is particularly advantageous in the fabrication of high quality, low resistance ultra-shallow p-n junction structures, the method comprising:

selectively oxidizing a silicon substrate to produce a predetermined pattern of silicon and silicon dioxide on the surface of the substrate;

introducing a flow of germane gas into an evacuated reaction vessel containing the substrate;

rapidly heating the substrate gas to a temperature at which the germane gas pyrolyzes into germanium atoms that will deposit upon the silicon surface, but which temperature is lower than the temperature at which germanium atoms will deposit upon a silicon dioxide surface so that germanium selectively deposits upon the silicon surface and not upon the silicon dioxide;

rapidly stopping the heating of the germane gas when the desired amount of germanium has been deposited upon the silicon layer;

adding dopant atoms to the deposited germanium; and annealing the deposited germanium to diffuse the dopant atoms into the silicon surface adjacent the deposited germanium to thereby form doped silicon portions that define corresponding p-n junctions with other portions of the silicon substrate and for which the deposited germanium serves as the contact material.

25. A method according to claim 24 further comprising the step of replacing the germane gas in the reaction vessel with a gas that will deposit a metal upon the deposited germanium and under conditions and for a time sufficient for a desired amount of the metal to deposit upon the germanium, and prior to the step of adding dopant atoms to the deposited germanium.

26. A method according to claim 24 further comprising annealing the deposited metal and germanium to form the metal-germanide compound upon the silicon portions while concurrently encouraging the dopant atoms present in the deposited germanium to migrate into the silicon substrate.

* * * * *

UNITED STATES PATENT AND TRADEMARK OFFICE
CERTIFICATE OF CORRECTION

PATENT NO. : 5,162,246
DATED : November 10, 1992
INVENTOR(S) : Ozturk et al.

It is certified that error appears in the above-identified patent and that said Letters Patent is hereby corrected as shown below:

On the title page:
In the Inventor's listing, insert "C." after "Mehmet" and insert "J." after Jimmie.

At column 1, line 22, delete "one" and substitute --One-- therefor.

At column 1, line 56, delete "desireable" and substitute --desirable-- therefor.

At column 4, line 46, insert a parenthesis after "dioxide".

At column 6, line 10, delete "lo" and substitute --10-- therefor.

At column 6, line 35, insert a period after "aligned".

At column 8, line 22, delete "GeH" and substitute --$GeH_4$-- therefor.

At column 8, line 44, delete "H" and substitute --$H_2$-- therefor.

At column 9, line 38, delete "the" before "annealing".

At column 9, line 40, delete "a silicon portions" and substitute --the silicon portions-- therefor.

UNITED STATES PATENT AND TRADEMARK OFFICE
CERTIFICATE OF CORRECTION

PATENT NO. : 5,162,246

DATED : November 10, 1992

INVENTOR(S) : Ozturk et al.

It is certified that error appears in the above-identified patent and that said Letters Patent is hereby corrected as shown below:

At column 10, line 11, delete "process if" and substitute --process is-- therefor.

Signed and Sealed this

Second Day of November, 1993

Attest:

BRUCE LEHMAN

*Attesting Officer*     *Commissioner of Patents and Trademarks*